(12) United States Patent
Mayer et al.

(10) Patent No.: US 7,469,130 B2
(45) Date of Patent: Dec. 23, 2008

(54) POLAR MODULATOR AND METHOD FOR DETERMINING AN AMPLITUDE OFFSET IN A POLAR MODULATOR

(75) Inventors: Christian Mayer, Kleinraming (AT); José Pedro Diogo Faisca Moreira, München (DE); Helmut Herrmann, München (DE); Günter Märzinger, Ulrichsberg (AT)

(73) Assignee: Infineon Technologies AG, Munich (DE)

( * ) Notice: Subject to any disclaimer, the term of this patent is extended or adjusted under 35 U.S.C. 154(b) by 473 days.

(21) Appl. No.: 11/255,439

(22) Filed: Oct. 21, 2005

(65) Prior Publication Data

US 2006/0089111 A1 Apr. 27, 2006

(30) Foreign Application Priority Data

Oct. 22, 2004 (DE) .................... 10 2004 051 596

(51) Int. Cl.
*H04B 1/04* (2006.01)
(52) U.S. Cl. .................... 455/116; 455/126; 330/149
(58) Field of Classification Search .................. None
See application file for complete search history.

(56) References Cited

U.S. PATENT DOCUMENTS 6,266,517 B1 * 7/2001 Fitzpatrick et al. ....... 455/114.3

7,072,626 B2 * 7/2006 Hadjichristos ............. 455/126
2002/0050372 A1 5/2002 Lee

FOREIGN PATENT DOCUMENTS

| DE | 195 35 075 A1 | 4/1996 |
|----|---------------|--------|
| DE | 199 29 167 A1 | 12/2000 |
| DE | 100 45 761 A1 | 3/2002 |
| DE | 102 55 863 A1 | 6/2004 |

* cited by examiner

*Primary Examiner*—Thanh C Le
(74) *Attorney, Agent, or Firm*—Eschweiler & Associates, LLC

(57) ABSTRACT

A polar modulator contains a first input for supplying an amplitude modulation word and a second input for supplying a phase modulation word. The first input is connected to a first signal path, and the second input is connected to a second signal path. The polar modulator contains a converter having a first input which is connected to a first signal path and having a second input which is connected to the second signal path. In this case, the converter is configured to output a radio-frequency signal derived from the phase modulation word and the amplitude modulation word. A feedback path has a level detector connected to the converter and has its output side connected to a correction device. The correction device is designed to output a correction word to the first signal path on the basis of a signal which is output by the level detector.

17 Claims, 3 Drawing Sheets

POLAR MODULATOR AND METHOD FOR DETERMINING AN AMPLITUDE OFFSET IN A POLAR MODULATOR

REFERENCE TO RELATED APPLICATIONS

This application claims the benefit of the priority date of German application DE 10 2004 051 596.4, filed on Oct. 22, 2004, the contents of which are herein incorporated by reference in their entirety.

FIELD OF THE INVENTION

The invention relates to a polar modulator and to a method for determining an amplitude offset in a polar modulator.

BACKGROUND OF THE INVENTION

In modern digital transmission systems, the data to be transmitted are combined in groups comprising a plurality of bits. A group comprising a plurality of bits, for example 3 bits in the mobile radio standard EDGE, is called a complex symbol. The complex symbol is supplied to a pulse shaping filter which produces a modulation signal in the form of a complex envelope therefrom. The modulation signal can be represented using Cartesian coordinates in the form $$m(k)=I(k)+jQ(k),$$

where the component I(k) is called the real component and Q(k) is called the quadrature component of a baseband signal.

To produce the complex envelope, a modulator is often used, as shown schematically in prior art FIG. 6. In this case, the two components I(k) and Q(k) of the signal m are in the form of digital signals and are supplied to the inputs 2a and 2b. Digital/analog converters 3a convert the two digital components I(k) and Q(k) into analog signals I'(k) and Q'(k) and supply them via low-pass filters 3b for rejecting harmonic components to an "I/Q modulator". Using two step-up frequency converters 3c, the analog components I'(k) and Q'(k) are converted to an output signal at the frequency RF and are output at the output 2c.

Advances in circuitry now make it possible to provide frequency and phase modulators which can be directly digitally actuated by suitable phase locked loops. An example of such a phase locked loop with direct digital actuation for phase and frequency modulation is described in German patent application DE 10255863.9.

The direct actuation of a phase locked loop for phase and frequency modulation means that it is now possible to use polar modulators for producing radio-frequency modulated output signals instead of the I/Q modulators used to date. A symbol can be represented as a complex modulation signal using polar coordinates in the form $$m(k)=A(k)\exp(j\phi(k)).$$

From the form of the complex baseband signal using polar coordinates which is shown above, it can be seen that a polar modulator modulates both the amplitude A(k) and the phase $\phi(k)$.

Phase modulation using the phase locked loop specified in DE 10255863.9 is possible without any great complexity.

In addition, however, amplitude modulation is also necessary. In this case, it should be remembered that the previously used polar modulators are particularly sensitive to errors in the amplitude path of the polar modulator, these being called offsets. The offsets produce additional signal components in the output signal which can result in an increased error rate during data transmission. Their cause is frequently unwanted DC components, for example as a result of leakage currents, which add a usually constant signal to the amplitude modulation signal.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a polar modulator in which the amplitude offsets are reduced. The invention is also directed to a method for determining an amplitude offset in a polar modulator which can be carried out using simple means and which allows the amplitude offset to be corrected.

In one embodiment of the invention, a polar modulator comprises a first input and a second input. The first input is connected to a first signal path that is configured to supply a discrete-value amplitude modulation word. The second input is connected to a second signal path that is configured to supply a discrete-value phase modulation word. A converter is provided which has a first input connected to the first signal path and a second input connected to the second signal path. The converter is configured to output a radio-frequency signal derived from the phase modulation word and the amplitude modulation word. A feedback path in the polar modulator is provided and includes a level detector which has an input connected to the converter. In addition, a correction device is provided having an input connected to an output of the level detector and an output coupled to the first input of the polar modulator. The correction device is configured to output an amplitude correction word on the basis of a level ascertained by the level detector.

In accordance with an aspect of the invention, the polar modulator contains a feedback path configured to correct an amplitude offset in the polar modulator. Correction allows the offset to be reduced in the amplitude path of the polar modulator and allows the signal quality to be increased. Correcting the amplitude offset present in the polar modulator using the feedback path and the correction device allows a polar modulator also to be used for amplitude and phase sensitive mobile radio standards.

In another embodiment of the invention, an input of the level detector is connected to an output of the converter, which forms a radio-frequency signal output. The detector is thus designed to ascertain the power of a radio-frequency signal at the output of the polar modulator.

In an alternative embodiment, the input of the level detector is connected to the first input of the converter. This embodiment allows level detection for an analog amplitude modulation signal prior to signal conversion. In particular, it is thus possible to determine an amplitude offset in the analog first signal path of the polar modulator.

In one example, the level detector includes a comparison circuit for comparing a signal which is output by the converter with a reference signal. This embodiment is advantageous when the level detector is connected to an output of the converter to tap off the analog amplitude modulation signal.

In one embodiment of the invention, the first signal path comprises a digital/analog converter with a downstream filter device, the digital/analog converter being coupled to the first input of the polar modulator. The filter device has its output connected to the converter. At this connection node, a summator is coupled between the input of the polar modulator and the digital/analog converter, whose second input is connected to the control device. The control device is configured to output a discrete-value correction word to the summator.

In another embodiment of the invention, the converter comprises an amplitude modulator having two signal inputs, with a first input connected to the first signal path and a second input connected to the second signal path. In one example, the amplitude modulator has an input that receives an amplitude modulation signal and a second input that receives a phase or frequency modulated signal. In an alternative embodiment, the converter includes a step-up frequency converter whose first input receives the amplitude modulation signal and whose second input receives a phase or frequency modulated signal.

In another embodiment of the invention, the second signal path of the polar modulator comprises a phase locked loop having a voltage controlled oscillator whose output is connected to the second input of the converter. The phase locked loop contains a control input for frequency setting that is connected to a modulator for producing a frequency setting word. The input of the modulator is coupled to the second input of the polar modulator.

In one example, the correction device is configures to ascertain an amplitude offset value for the first signal path using successive approximation.

In accordance with another embodiment of the invention, a method for determining the amplitude offset in a polar modulator comprises providing a polar modulator having an amplitude modulation input and a signal output is provided, and isolating the amplitude modulation input from a supply line for an amplitude modulation word. A quiescent signal level which is output at the signal output of the polar modulator is then ascertained.

The inventive method allows a polar modulator to determine an amplitude offset by virtue of the polar modulator being isolated from the supply of an amplitude modulation word. This can be done, for example, by deactivating the input. The amplitude offset which exists in the polar modulator on account of component variations, leakage currents and other parameters which cannot be influenced results in a quiescent signal level of the signal output of the polar modulator. This quiescent signal level is ascertained and the amplitude offset of the polar modulator is determined.

Advantageously, in another embodiment the method also comprises the following converting the ascertained quiescent signal level into a correction word and supplying the correction word to the amplitude modulation input in order to correct the amplitude offset.

Accordingly, the inventive method can easily be extended, so that an amplitude offset in the polar modulator can be corrected by supplying a suitable derived signal to the amplitude modulation input.

In one example, this correction is made by subtracting the correction word from an amplitude modulation word supplied to the amplitude modulation input.

In another embodiment of the method, a power detector is provided and this power detector is coupled to the signal output of the polar modulator. By way of example, an input of the power detector can be connected directly to the output of the polar modulator. When the output power has been ascertained, a correction word is produced and this correction word is supplied to the amplitude modulation input of the polar modulator. The method, in this example, is repeated until a minimum is reached for the ascertained output power. In one example, the method is carried out using successive approximation, as a result of which a minimum is reached in a plurality of repeats of the method.

Alternatively, a comparison circuit can be coupled to a signal path in the polar modulator for the amplitude modulation. In that case, a correction signal is produced and this correction signal is supplied to the polar modulator. The correction signal is altered until a minimum is reached or until a result for the comparison is different than a result for a comparison at a previous time.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

Further advantageous embodiments are covered by the subclaims. The invention is explained in detail below with reference to the drawings, in which:

DETAILED DESCRIPTION OF THE INVENTION

Figure 1:
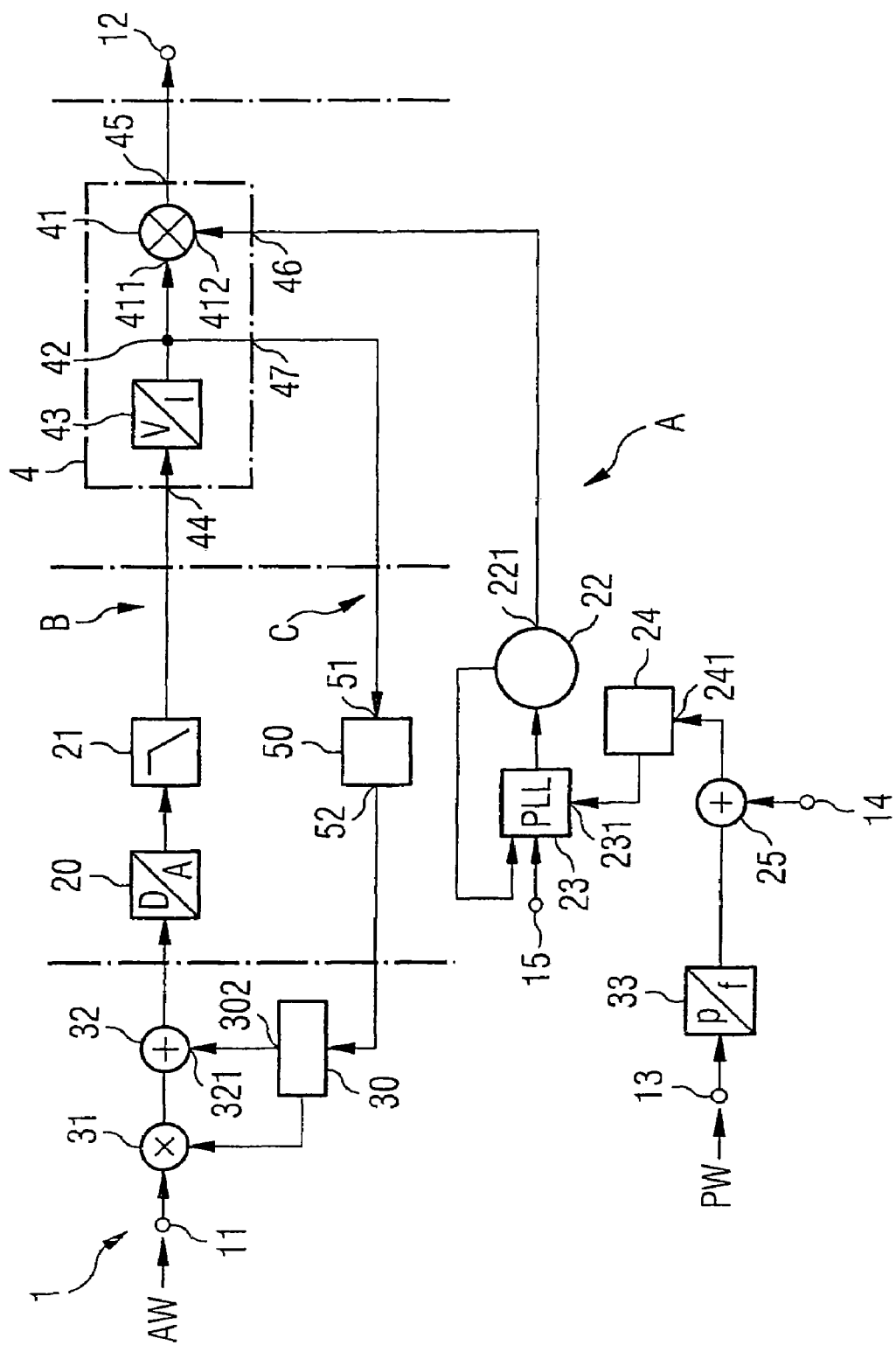
FIG. 1 is a block level schematic diagram illustrating a first exemplary embodiment of the invention.

FIG. 1 shows a first exemplary embodiment of a polar modulator based on the invention. The polar modulator has a first signal input 11 and a second signal input 13. The first signal input 11 is designed to supply a discrete-value amplitude modulation word AW, and the second signal input is designed to supply a discrete-value phase or frequency modulation word PW. On the output side, the polar modulator 1 contains an output 12 at which it is possible to tap off the modulated signal converted to the carrier frequency.

The input 11 is connected to a switching device 31 which can isolate the input 11 from the rest of the polar modulator. The switching device 31 is actuated by a correction apparatus 30. An output of the switching device 31 is connected to an adder 32 whose second input 321 is connected to the output 302 of the correction device 30. The output side of the summator is connected to a digital/analog converter 20 which is coupled via a low-pass filter 21 to a converter 4 in the polar modulator 1. The signal path comprising switch 31, summator 32, analog/digital converter 20 and filter 21 forms an amplitude modulation part B for the polar modulator.

In the present embodiment, the converter 4 contains a voltage/current converter 42 which converts a voltage signal applied to the input side into a current signal and supplies this signal to the actual amplitude modulator 41. The amplitude modulator 41 has a first input 411 which is connected to the voltage/current converter 42. In addition, it comprises a second input 412. The second input 412 is used to supply a phase modulated radio-frequency signal. The radio-frequency signal has its amplitude modulated in the amplitude modulator on the basis of an amplitude modulation signal applied to the input 411 and is supplied to the output 12 of the polar modulator.

The second input 412 of the amplitude modulator 41 is connected to an output 221 of a voltage controlled oscillator 22 which forms part of a phase locked loop.

The control loop additionally comprises a phase detector having a downstream charge pump and also a frequency divider arranged in a feedback path of the control loop, these elements being shown as a joint circuit block 23 in this case. The phase locked loop comprising the circuit block 23 and the voltage controlled oscillator 22 is supplied with a reference signal via an input 15. In addition, a control input 231 is provided which is used to set a divider ratio for the frequency divider in the circuit block 23 and hence to set an output frequency for the output signal from the voltage controlled oscillator. To this end, the control input 231 is connected to an output of a $\Sigma\Delta$ modulator 24 (sigma-delta modulator). The modulator 24 produces a control signal from a frequency word applied to its input 241 and supplies this signal to the control input 231 of the control loop.

The input 241 of the $\Sigma\Delta$ modulator 24 is connected to a summator 25 which can firstly be supplied with a setting word at the input 14 for a frequency setting and can secondly be supplied with a phase or frequency modulated word at a second input. To this end, the second input is coupled to a phase-frequency converter 33 which has its input side connected to the input 13 of the polar modulator and which converts a phase-frequency modulation word into a corresponding setting word for altering the divider ratio.

Such phase/frequency modulators, which modulate a frequency by directly altering a divider ratio for a frequency divider in the feedback path of a phase locked loop in order to alter the output signal from the voltage controlled oscillator in the control loop, are known from German patent applications 10255863.9 and 19929167.5. The control loop illustrated in the exemplary embodiment with the upstream $\Sigma\Delta$ modulator 24, with the summator 25 and with the phase-frequency converter 33 forms a phase modulation path A for the polar modulator.

For the purpose of correcting an amplitude offset which appears within the polar modulator, primarily in the amplitude signal path, a tap 42 is provided between the voltage/current converter 43 and the amplitude modulator 41. The tap 42 is connected to a feedback path C. This feedback path comprises a comparison circuit 50, which has its output side connected to the correction unit 30.

In principle, an amplitude offset is corrected by detecting a quiescent signal level which is obtained at the output 12 of the polar modulator on account of the offset in the amplitude modulation path B when no input word AW is applied. In the present exemplary embodiment, an analog amplitude modulation signal which essentially forms the amplitude offset is supplied to the comparison circuit 50, which compares the applied signal with a reference level, produces a control signal therefrom and supplies it to the correction unit 30. The control signal, in one example, has two possible states, depending on whether the amplitude offset is larger or smaller than the reference value. In one example, the reference value is equal to zero, so that the amplitude offset may be negative or positive as a result. If the amplitude offset in the amplitude modulation path B is greater than zero, a negative correction signal needs to be added.

Figure 4:
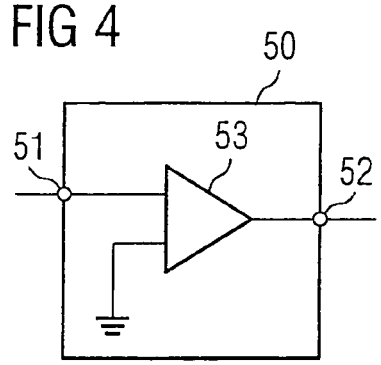
FIG. 4 is a schematic diagram illustrating a first exemplary embodiment of a level detector as provided in the invention.

FIG. 4 shows an exemplary embodiment of a comparison circuit which contains a differential amplifier 53. The latter produces a differential signal from the signal applied to the input 51 and the ground potential at the second input of the differential amplifier 53. The differential amplifier thus operates as a decision-making unit determining whether the amplitude offset signal is larger or smaller than the reference signal.

The output signal is used by the correction unit to determine the amplitude offset. The correction word for the offset is produced by the correction device 30 and is injected into the amplitude modulation path B of the polar modulator via the summator 32. Ideally, the correction word is chosen such that it precisely compensates for the amplitude offset which exists in the amplitude signal path.

Figure 2:
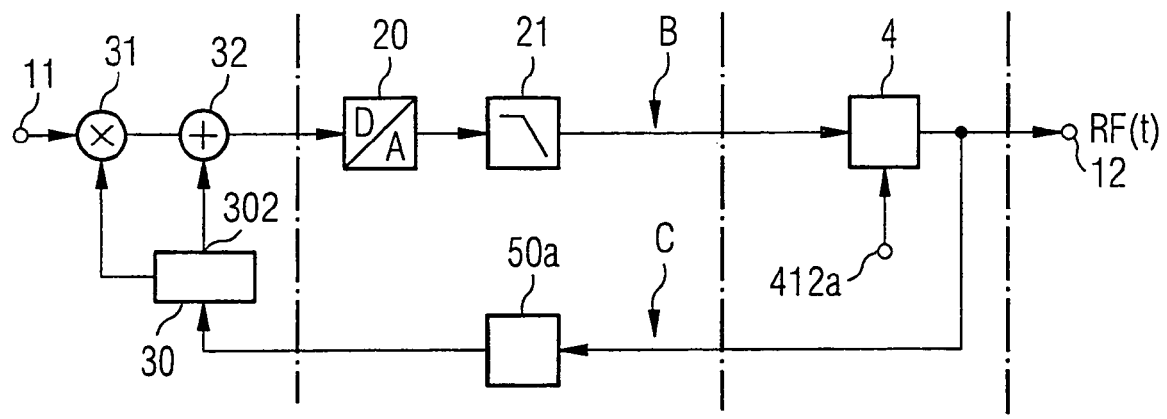
FIG. 2 is a block level schematic diagram illustrating an alternative embodiment of the invention.

An alternative form of a polar modulator is shown in FIG. 2 in accordance with an alternative embodiment of the present invention. Components which have the same function or action bear the same reference symbols. The phase modulation path A has not been illustrated. The analog signal is supplied at the input 412a of the converter 4, which contains the amplitude modulator.

One difference in this embodiment is that the feedback path C contains a power detector 50A which has its input connected to the output 12 of the polar modulator. The power detector ascertains the absolute output power and produces therefrom a signal which is dependent on the output power. The correction device 30 thus forms a correction word. In this context, a correction is made until a minimum is detected in the output power.

The embodiment shown in FIG. 2 thus determines the radio-frequency output power, while in the exemplary embodiment shown in FIG. 1 a signal is directly evaluated in the amplitude modulation path B.

Figure 5:
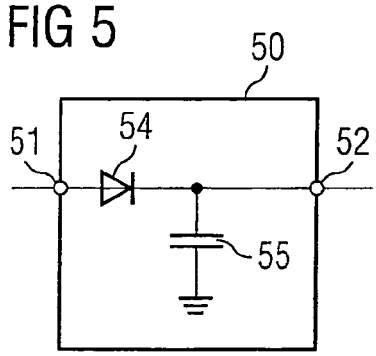
FIG. 5 is a schematic diagram illustrating a second example of a level detector as provided in the invention.
Figure 6:
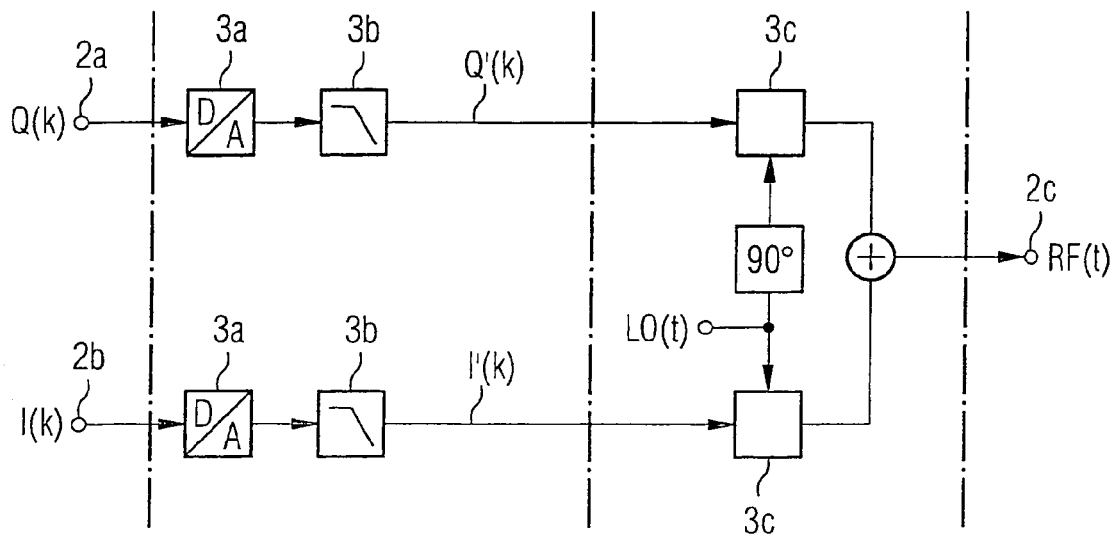
FIG. 6 is a prior art schematic diagram illustrating a known I/Q modulator.

An example of a simple power detector is shown in FIG. 5. The detector 50 contains a diode which rectifies the radio-frequency signal applied to the input side and outputs it at the output 52 via a capacitor 55 acting as a low-pass filter. The output signal is thus directly proportional to the quiescent signal level of the polar modulator.

Figure 3:
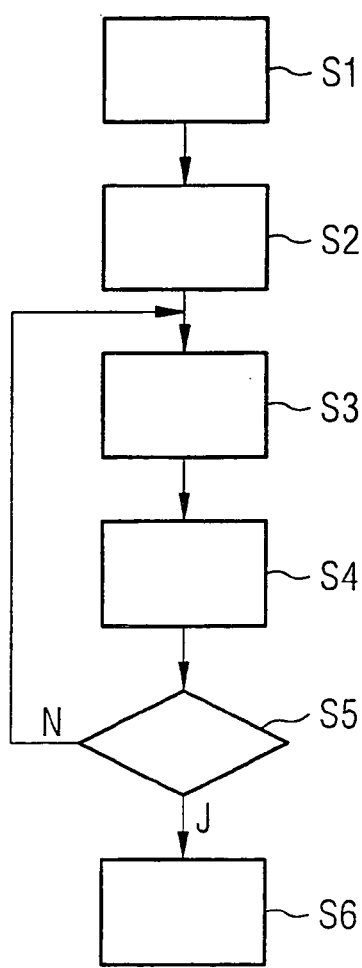
FIG. 3 is a flow chart diagram illustrating an embodiment of the method according to the invention.

FIG. 3 shows an embodiment of a method for determining the amplitude offset and for subsequent correction. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

For the purpose of calibrating the present arrangement, the correction device 30 isolates the input 11 of the polar modulator from the rest of the amplitude modulation path B at S1. This is necessary, in one example, in order to determine an amplitude offset for the amplitude signal path in the polar modulator without influence by signals injected via the input 11.

At S2, an amplitude offset without an applied correction word is then measured for the first time. At S3, the level ascertained by the detector 50 is supplied to the correction unit 30, which processes it and produces a correction word therefrom at its output 302. This correction word is now added to the amplitude signal path of the polar modulator using the summator 32. At S4, the level of the amplitude signal path in the polar modulator is measured again. This level is now made up of the inherently present amplitude offset plus or minus the correction word supplied by the correction device 30.

If the signal produced by the correction word and the amplitude offset are the same size at S5, but have different arithmetic signs, a quiescent signal level disappears, which means that the detector 50 records a minimum. The method can then be terminated at S6 by storing the correction word in the correction device 30. At the same time, the input 11 can again be connected to the polar modulator. The correction signal is now added to amplitude modulation signals applied to the input side, and the amplitude offset of the polar modulator is corrected as a result.

If the detector continues to ascertain a quiescent signal level at S4, on the other, then at S5 the process branches to S3 again, the correction device 30 produces a new correction word and supplies it to the amplitude signal path in the polar modulator.

In an alternative refinement of the method, in acts S2 and S4, a signal in the amplitude modulation path B of the polar modulator is compared with a reference signal, and a correction word is produced therefrom. The correction word is added and the signal in the amplitude modulation path B is again compared with the reference signal. If the comparison at S4 now provides a result which is different than that from act S4 at a previous time, it is possible to continue to S6. Otherwise, the process branches to S3 again to S5.

In one example, the amplitude offset is calibrated or compensated for via the correction device 30 using successive approximation. Such an embodiment makes it possible to calibrate or determine the amplitude offset at later times and using different modes of operation or different external parameters, too. By way of example, it is thus also possible to ascertain and correct temperature effects in the polar modulator.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, the term "exemplary" as utilized herein merely means an example, rather than the best.

The invention claimed is:

1. A polar modulator, comprising:
an output;
a first input configured to receive an amplitude modulation signal connected to a first signal path;
a second input configured to receive a phase modulation signal connected to a second signal path;
a converter having a first input, a second input, a first tap, and a second tap forming the converter output, wherein the converter is configured to output a radio-frequency signal derived from the phase modulation signal and the amplitude modulation signal to the second tap, wherein the first input of the converter is connected to the first signal path, and the second input is connected to the second signal path;
a feedback path comprising a level detector configured to measure a power of a signal and generate a signal in response thereto, comprising an input connected to at least one of the first and second taps of the converter; and
a correction device having an input connected to an output of the level detector, and an output configured to output an amplitude correction signal to the first signal path on the basis of the signal output by the level detector.

2. The polar modulator of claim 1, wherein the level detector is configured to measure the power of a radio-frequency signal and is connected to the output of the converter, which forms an output of the polar modulator.

3. The polar modulator of claim 1, wherein the level detector further comprises a comparison circuit configured to compare a signal at the output of the converter with a reference signal.

4. The polar modulator of claim 1, wherein the first signal path comprises a digital/analog converter with a downstream filter device, wherein the digital/analog converter is coupled to the first input, and the filter device having an output coupled to the converter.

5. The polar modulator of claim 1, wherein an input of the level detector is coupled to the first input of the converter.

6. The polar modulator of claim 1, wherein the converter comprises an amplitude modulator having a first input coupled to the first signal path and configured to receive an analog amplitude modulation signal thereat, and a second input connected to the second signal path.

7. The polar modulator of claim 1, wherein the second signal path comprises a phase locked loop having a voltage controlled oscillator with an output connected to the second input of the converter, the phase locked loop further having a control input for frequency setting connected to a modulator, the modulator configured to produce a frequency setting word and having an input thereof coupled to the second input of the polar modulator.

8. The polar modulator of claim 1, wherein the correction device is configured to ascertain an amplitude offset value for the first signal path using successive approximation.

9. A method for determining an amplitude offset in a polar modulator, comprising:
providing a polar modulator having an amplitude modulation input configured to receive an amplitude modulation signal connected to a first signal path, and having a signal output;
isolating the amplitude modulation input from a supply line for the amplitude modulation signal;
ascertaining a quiescent signal level at the signal output of the polar modulator, after the isolating, wherein the quiescent signal level is indicative of the amplitude offset;
converting the ascertained quiescent signal level into a correction signal; and
supplying the correction signal to the amplitude modulation input.

10. The method of claim 9, wherein supplying the correction signal comprises:
preparing the amplitude modulation input for supplying the amplitude modulation signal;
supplying the amplitude modulation signal; and subtracting the correction signal from the amplitude modulation signal.

11. The method of claim 9, wherein ascertaining the quiescent signal level comprises:
providing a power detector;
coupling the power detector to the signal output of the polar modulator;
ascertaining an output power with the power detector;
producing a correction signal based on the ascertained output power;
supplying the correction signal to the amplitude modulation input;
repeating the last three actions until a minimum is reached in the ascertained output power.

12. The method of claim 9, wherein ascertaining the quiescent signal level comprises:
providing a comparison circuit;
coupling the comparison circuit to the polar modulator;
comparing an output signal from the polar modulator to a reference signal;
producing a correction signal based on a comparison result;
supplying the correction signal to the amplitude modulation input;
repeating the last three actions until a minimum is reached in the output power.

13. A polar modulator, comprising:
an amplitude modulation input configured to receive an amplitude modulation signal;
a phase or frequency modulation input configured to receive a phase or frequency modulation signal;
an amplitude offset compensation circuit configured to evaluate a characteristic of the amplitude modulation signal or an output of the polar modulator and generate an offset correction signal in response thereto;
an adder circuit configured to combine the amplitude modulation signal and the offset correction signal to form a compensated amplitude modulation signal; and
a converter circuit configured generate a modulated RE signal based on the compensated amplitude modulation signal and the phase or frequency modulation signal.

14. The polar modulator of claim 13, further comprising a phase locked loop circuit configured to generate a phase or frequency modulated carrier signal based on the phase or frequency modulation signal, and supply the modulated carrier signal to the converter circuit for generation of the modulated RF signal.

15. The polar modulator of claim 13, wherein the amplitude offset compensation circuit comprises a comparison circuit configured to generate the offset correction signal based on a comparison of a power level of the amplitude modulation signal at the converter circuit or the modulated RF signal at the polar modulator output and a predetermined threshold.

16. The polar modulator of claim 13, further comprising an isolation switch configured to selectively isolate the amplitude modulation input from the converter circuit in an offset compensation determination mode.

17. The polar modulator of claim 16, wherein the amplitude offset compensation circuit is configured to activate the isolation.

* * * * *

UNITED STATES PATENT AND TRADEMARK OFFICE
CERTIFICATE OF CORRECTION

PATENT NO.         : 7,469,130 B2
APPLICATION NO.    : 11/255439
DATED              : December 23, 2008
INVENTOR(S)        : Christian Mayer et al.

Page 1 of 1

It is certified that error appears in the above-identified patent and that said Letters Patent is hereby corrected as shown below:

Column 10, claim 13, line 8: please replace "RE" with --RF--

Signed and Sealed this

Seventeenth Day of February, 2009

JOHN DOLL
*Acting Director of the United States Patent and Trademark Office*